United States Patent
Uhlig et al.

(10) Patent No.: US 10,388,785 B2
(45) Date of Patent: Aug. 20, 2019

(54) LDMOS TRANSISTORS FOR CMOS TECHNOLOGIES AND AN ASSOCIATED PRODUCTION METHOD

(71) Applicant: X-FAB SEMICONDUCTOR FOUNDRIES AG, Erfurt (DE)

(72) Inventors: Thomas Uhlig, Dresden (DE); Lutz Steinbeck, Dresden (DE)

(73) Assignee: X-FAB SEMICONDUCTOR FOUNDRIES AG, Erfurt (DE)

(*) Notice: Subject to any disclaimer, the term of this patent is extended or adjusted under 35 U.S.C. 154(b) by 0 days.

(21) Appl. No.: 15/798,792

(22) Filed: Oct. 31, 2017

(65) Prior Publication Data
US 2018/0166567 A1    Jun. 14, 2018

Related U.S. Application Data

(60) Continuation of application No. 14/971,699, filed on Dec. 16, 2015, now abandoned, which is a division of application No. 13/635,535, filed as application No. PCT/IB2011/051505 on Apr. 7, 2011, now Pat. No. 9,224,856.

(30) Foreign Application Priority Data

Apr. 9, 2010   (DE) ................. 10 2010 014 370

(51) Int. Cl.
*H01L 29/78* (2006.01)
*H01L 21/8238* (2006.01)
*H01L 27/092* (2006.01)
*H01L 29/06* (2006.01)
*H01L 29/66* (2006.01)
*H01L 29/10* (2006.01)

(52) U.S. Cl.
CPC .. *H01L 29/7816* (2013.01); *H01L 21/823814* (2013.01); *H01L 27/092* (2013.01); *H01L 29/0619* (2013.01); *H01L 29/0649* (2013.01); *H01L 29/1095* (2013.01); *H01L 29/665* (2013.01); *H01L 29/66659* (2013.01); *H01L 29/66681* (2013.01); *H01L 29/7835* (2013.01); *H01L 29/063* (2013.01); *H01L 29/0653* (2013.01)

(58) Field of Classification Search
CPC ............................ H01L 29/063; H01L 27/092
See application file for complete search history.

(56) References Cited

U.S. PATENT DOCUMENTS 6,451,640 B1 * 9/2002 Ichikawa ........ H01L 21/823892
257/E21.644
2002/0098637 A1 * 7/2002 Hossain ................ H01L 21/266
438/200

(Continued)

*Primary Examiner* — Caridad Everhart
*Assistant Examiner* — Ankush K Singal
(74) *Attorney, Agent, or Firm* — Robert A. King; Greenberg Traurig, LLP

(57) ABSTRACT

In a semiconductor component or device, a lateral power effect transistor is produced as an LDMOS transistor in such a way that, in combination with a trench isolation region (12) and the heavily doped feed guiding region (28, 28A), an improved potential profile is achieved in the drain drift region (8) of the transistor. For this purpose, in advantageous embodiments, it is possible to use standard implantation processes of CMOS technology, without additional method steps being required.

13 Claims, 3 Drawing Sheets

(56) References Cited

U.S. PATENT DOCUMENTS

| | | | |
|---|---|---|---|
| 2004/0108549 A1* | 6/2004 | Denison | H01L 29/1095 257/335 |
| 2005/0062102 A1* | 3/2005 | Dudek | H01L 29/0653 257/335 |
| 2006/0006461 A1 | 1/2006 | Chidambaram | |
| 2008/0067617 A1 | 3/2008 | Hachiyanagi et al. | |
| 2009/0315113 A1* | 12/2009 | Vashchenko | H01L 27/0262 257/355 |

* cited by examiner

LDMOS TRANSISTORS FOR CMOS TECHNOLOGIES AND AN ASSOCIATED PRODUCTION METHOD

CROSS-REFERENCE RELATED APPLICATIONS

This application is a Continuation of U.S. patent application Ser. No. 14/971,699, filed Dec. 16, 2105, which is a Divisional of U.S. patent application Ser. No. 13/635,535, filed Dec. 11, 2012, now U.S. Pat. No. 9,224,856, which is a U.S. National Stage Application of International Application of PCT/IB2011/051505 filed Apr. 7, 2011, which claims benefit of German Patent Application No. 10 2010 014 370.7 filed Apr. 9, 2010, the disclosures of which are herein incorporated by reference in their entireties.

FIELD OF DISCLOSURE

The invention relates to lateral DMOS transistors (LDMOS) producible in CMOS processes and having improved characteristics and relates to an associated production method.

BACKGROUND OF THE DISCLOSURE

Power field effect transistors in the form of DMOS transistors (originally: double diffused MOS) have evolved over the last years into indispensable devices in the semiconductor high-voltage (HV) and power processes. Generally, a field effect transistor comprises so-called drain and source regions that are separated by a channel region, which in turn is controlled by the gate electrode such that a controllable current flow is created between the drain region and the source region. Hereinafter, a power field effect transistor shall be understood as a field effect transistor that is operated at voltages of 15V or higher and/or at drive currents of approximately 500 mA or higher. Hereinafter, field effect transistors are also referred to as MOS transistors irrespective of the material that is actually used in the gate electrode.

The active principle of lateral DMOS transistors is based on prolonged drain regions, across which a part of the voltage to be processed drops that, without a voltage drop, would damage the gate area and therefore must not be applied at the gate electrode at full magnitude. In lateral DMOS transistors (LDMOS) this prolonged area of the drain region, referred to as drain extension or drift region, is arranged parallel to the surface of the active semiconductor layer of the chip, thereby enabling a simple integration into existing CMOS processes. A CMOS process is to be understood as a process strategy, in which complementary field effect transistors, i.e. p-channel transistors and n-channel transistors, are fabricated in and above the active semiconductor layer. Hence, in the CMOS manufacturing strategy processes are required, which enable the generation of drain and source regions of p-conductivity and the generation of drain and source regions of n-conductivity.

To this end, typically appropriate implantation techniques are used wherein an appropriate masking scheme is employed in order to form the doped regions with different conductivity type.

Frequently, in such HVCMOS processes, that is in CMOS processes, in which field effect transistors are designed for high-power or high voltage, both n-conductive and p-conductive LDMOS transistors (nLDMOS transistors, pLDMOS transistors) are required. The concurrent optimisation of both conductivity types at reduced complexity is thus a particular challenge.

This problem is the subject matter of WO 2008/116880 A1 (X-Fab), which, however, is only insufficiently addressed therein.

The most recent development in DMOS transistors is characterised by the consequent employment of the RESURF principle (Reduced Electrical Surface Field), wherein it is increasingly accomplished to resolve the characteristic conflict between a breakdown voltage as high as possible in the off-state (off-breakdown $BV_{off}$) and low on-resistance (drain-source on-resistance RDSon). A particular class in this respect represent the so-called super junction transistors which achieve extraordinarily high conductivity in the drift region at a high $BV_{off}$ by means of n/p multi-layers.

With the demand for an increased fraction of digital circuitry in HVCMOS applications a tendency has evolved towards reduced structural dimensions of the corresponding basic processes. HVCMOS developments nowadays typically take place in 0.35 to 0.13 µm processes, i.e. in processes, in which small signal transistors having critical dimensions, such as the gate length, of approximately 200 nm to approximately 65 nm are fabricated, whose field isolation is substantially exclusively based on shallow trenches including an appropriate insulating fill material (shallow trench isolation STI). The majority of LDMOS transistors developed in such processes comprises (buried) drift paths extending below the trench isolation region thereby taking advantage of the high quality insulating material of the trench isolation as a top boundary of the current path. However, the inclusion of the drift region of such transistors at the gate and drain side requires specific constructive measures, since the current path has to be guided from the area below the trench isolation region back to the surface without compromising device reliability. Furthermore, also in these areas an optimal ratio between potential drop and conductivity should prevail.

As a constructive solution for the implementation of the drift region at the gate side split-gate transistors have been proposed, among others, which allow a manipulation of the electric field near the gate at the beginning of the drift path independently from the channel field.

For constructing the implementation at the drain side, on the other hand, the publication WO 2007/103610 A2 (Freescale) proposes to route the drift path of an LDMOS transistor below the trench isolation region at the gate side only and to prevent silicidation in the thus prolonged active region at the drain side by using a silicide blocker.

FIG. 1 illustrates a schematic side view of the conventional power field effect transistor (LDMOS) 150 of this document WO 2007/103610 A2 in the form of an n-channel transistor comprising deeper lying p/n layers that are referred to as 102, 104 and 106, respectively. That is, the layer 102 is n-doped, while the layers 106, 104 are p-doped. Furthermore, in the lightly p-doped region 106 a p-well 110 is formed, which thus represents the p-doped body region of the transistor 100. A heavily n-doped source region 118 in combination with a heavily p-doped region 120 acting as a body connection is formed in the p-well 110. Furthermore, a drain drift region 108 in combination with a heavily doped drain region 122 is provided, wherein, as discussed above, a trench isolation region 112 is embedded in the drain drift region 108. Moreover, a gate electrode structure 114 comprising a gate dielectric 116 is provided above the p-well and a part of the drain drift region 108 as well as the trench isolation region 112. The formation of silicide on exposed surface areas of the drain drift region 108 is prevented by a dielectric layer 124.

The results of the configuration of the power field effect transistor 150 shown in FIG. 1 is a wider current path extending with reduced inclination to the drain region 122, thereby reducing $RDS_{on}$. At the same time the tendency for impact ionisation (Avalanche) is less due to the reduced current density. Consequently, for the same drain current a reduced bulk current, that is, a current into deeper layers of the transistor 150, is generated. In this way the turning on of the internal parasitic bipolar transistors (snap-back in the nLDMOS) is delayed, thereby achieving a higher on-breakdown voltage. In particular when—as is typical in cost efficient processes including multiple usage of masks—the dopant profile of the drift zone 108 may not exclusively be tailored with respect to a single transistor type, with this solution frequently $BV_{off}$ is too low due to incomplete depletion in the area of the drain region 122.

It is an object of the invention to increase the breakdown voltage in a semiconductor device as $BV_{off}$ in LDMOS transistors having a drain drift region, wherein a production of n-conductive and/or p-conductive LDMOS transistors in the semiconductor device in a CMOS process should be doable as efficiently as possible.

According to one aspect of the present invention this object is solved by a semiconductor device that comprises a lateral power field effect transistor. The lateral power field effect transistor comprises a source region of a first conductivity type, a drain region of the first conductivity type, a drain drift region of the first conductivity type, a trench isolation region that is at least partially embedded in the drain drift region, and a doped field guiding region of a second conductivity type that is inverse to the first conductivity type.

In the inventive power field effect transistor the trench isolation region and in particular the doped field guiding region embedded in the drain drift region results in a superior electric field distribution, that is, a forced guiding of potential lines is achieved in the vicinity of the drain region, however without pronounced interferences of the field profile in the lower layers of the semiconductor device taking place. For example, the RESURF regions remain substantially unaffected by the field guiding region and also no electrically chargeable zones are generated. A doped field guiding region or field guide region is to be understood in this context as an area that is counter-doped with respect to the drain drift region and thus forms a pn junction therewith and influences the profile of the electrical field within the drain drift region.

To this end in one advantageous embodiment the doped field guiding region is provided as a region having a freely adjustable potential without an electrical connection. A field guiding region without an electrical connection is also referred to as floating. In this manner, there is no influence on the field line profile by external voltages.

In advantageous embodiments at least one further field guiding region of the second conductivity type is provided in the drain drift region. In this manner it is nevertheless possible to achieve a desired control of the field profile in the drain drift region on the basis of a basic dopant profile by appropriately selecting the size and/or the number of field guiding regions. In this case in some advantageous embodiments one of the field guiding regions may directly abut on the trench isolation region at an edge thereof that faces the drain region. Due to this measure a very superior field profile is obtained, since firstly the bottom side of the trench isolation region serves as an efficient means for adapting the field profile and thereafter the field guiding region enables the electrical field in the upper area of the drain drift region to gradually broaden.

In further advantageous embodiments there is not provided any metal silicide in a surface of the drain drift region. In this manner the advantageous field profile that is described in the context of FIG. 1 may be improved in that even partially depleted regions in the vicinity of the drain region are avoided, thereby increasing the breakdown voltage.

In a further advantageous embodiment the lateral power field effect transistor comprises a doped body connection region of the second conductivity type adjoining to the source region, wherein the field guiding region and the doped body connection region have a same dopant profile in the depth direction. Therefore these corresponding doped regions that have an inverse doping type compared to the drain and source regions may be formed in a common implantation sequence.

In a further advantageous embodiment the maximum dopant concentration of the field guiding region is greater than a maximum dopant concentration of the body connection region. By appropriate selection of the dopant concentration of the field guiding region in combination with its size and also the number of field guiding regions an efficient control of the field profile in the drain drift region is obtained, while still standard implantation processes may be applied. For example, the increased maximum dopant concentration may be generated by subjecting the field guiding region in the context of the required implantation processes to at least one further implantation process compared to, for instance, the body connection region.

In a further embodiment the semiconductor device comprises a small signal transistor that has deep drain and source regions and shallow drain and source extension regions. In this context a small signal transistor is to be understood as a transistor designed for being operated at voltages of less than (or equal to) 15V. In this case, these highly doped regions of the small signal transistor may have substantially the same dopant profiles as the field guiding region, since they are formed during the same implantation sequence. For example, the field guiding region may be formed during an implantation for producing shallow drain and source regions, while in other cases the field guiding region is produced during the formation of deep drain and source regions of the small signal transistor, wherein, if required, also the implantation of the shallow drain and source regions may have previously been performed in the field guiding region.

In some advantageous embodiments the small signal transistor comprises a gate electrode having a gate length of 200 nm (nanometre) or less. In this manner the power field effect transistor may be produced on the basis of a technology, with which also highly sophisticated control tasks may be implemented by providing small signal transistors having the above-referenced dimensions.

In further advantageous embodiments there is provided a second lateral power field effect transistor of complementary conductivity type compared to the already provided field effect transistor.

According to a further aspect of the claimed dimension the above-referenced objects is solved by a method for producing a semiconductor device or semiconductor component having a lateral power field effect transistor. The method comprises the forming of a trench isolation region and a drain drift region of a first conductivity type such that the trench isolation region is at least partially embedded in the drain drift region. The method further comprises performing one or more ion implantation processes for forming deep drain and source regions and/or drain and source extension regions in a small signal transistor of a second conductivity type that is inverse to the first conductivity type. The method further comprises performing one or more field guiding regions in the drain drift region by at least one of the one or more ion implantation processes.

In this manner an appropriate field distribution in the drain drift region of the power transistor is achieved by using implantation processes that are also used for forming highly doped regions in small signal transistors. Thereby, a highly efficient manufacturing flow is achieved, since no additional process steps are required. To this end, the implantation processes for forming the shallow drain and source extension regions and/or the implantation processes for forming the deep drain and source regions may be used. In particular the implantation processes and the associated masking schemes for the formation of complementary small signal transistors may efficiently be used in order to also form appropriate field guiding regions for complementary power transistors. To this end appropriate photolithography masks may be produced, which expose during corresponding surface areas of the drain drift region the respective implantation processes in order to enable the lateral structure of the field guiding regions to be adjusted in an efficient manner. Hence, on the basis of the standard implantation processes the desired field profile in the drain drift region may specifically be adjusted for the respective application by providing appropriate mask openings without requiring a change of process parameters of the associated implantation processes and without adding further process steps.

Generally, the claimed invention enables achievement of higher off-breakdown voltages at reduced on-resistance and in particular for an nLDMOS transistor concurrently higher on-breakdown voltages compared to known solutions without requiring additional masking steps during the production.

Further advantageous embodiments are defined in the dependent claims.

The following detailed description illustrates examples and an explanation and supplement of the claimed invention. It is to be expertly studied with reference to the drawings.

Figure 3:
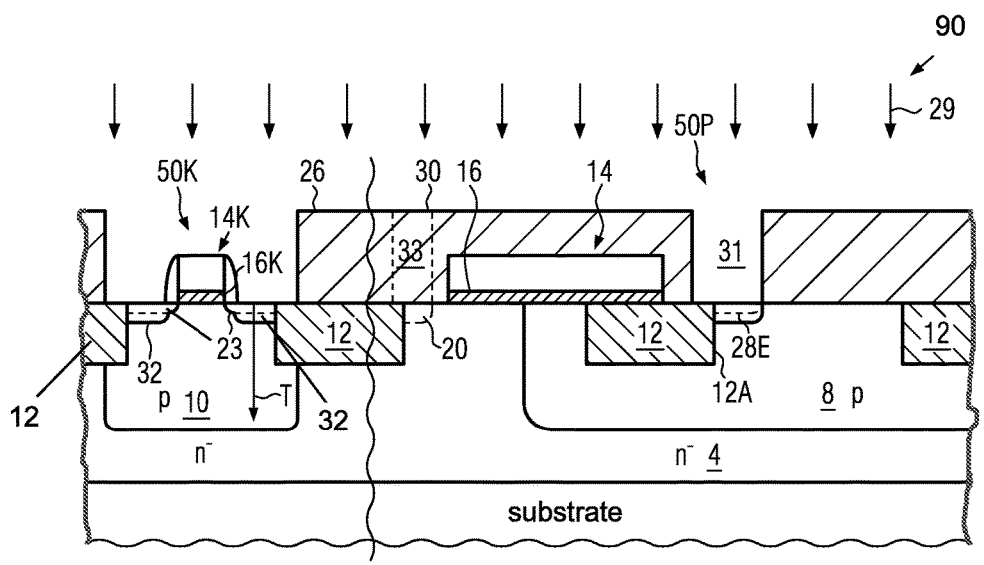

FIG. 3 as a schematic cross-sectional view of the semiconductor device, wherein an implantation process for forming deep drain and source regions is performed.

Figure 4:
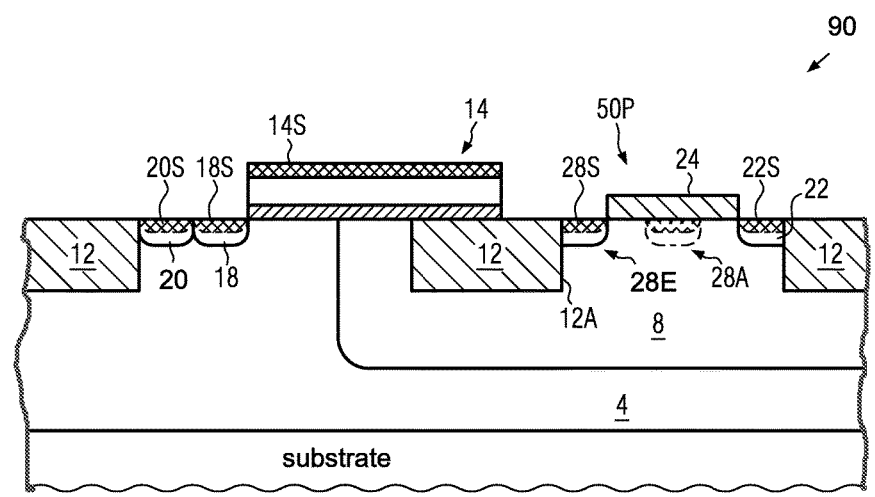

FIG. 4 is a schematic cross-sectional view of a part of the semiconductor device after having performed a silicide process.

Figure 2:
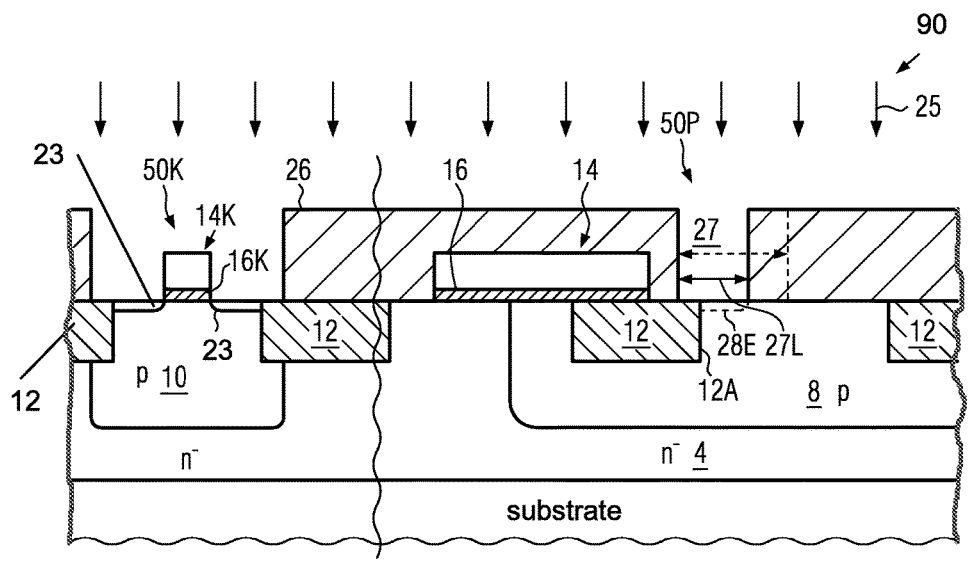
FIG. 2 is a sectional view of a semiconductor device during a manufacturing phase, in which an implantation process for forming shallow drain and source extension regions is performed, wherein, if required, at the same time a field guiding region is formed in a power transistor.
Figure 5:
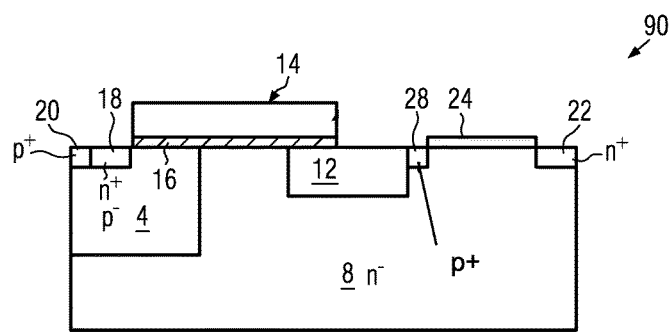

FIG. 5 is a cross-sectional view of a complementary power field effect transistor that is provided alternatively or additionally to the transistor of FIGS. 2 to 4.

Figure 1:
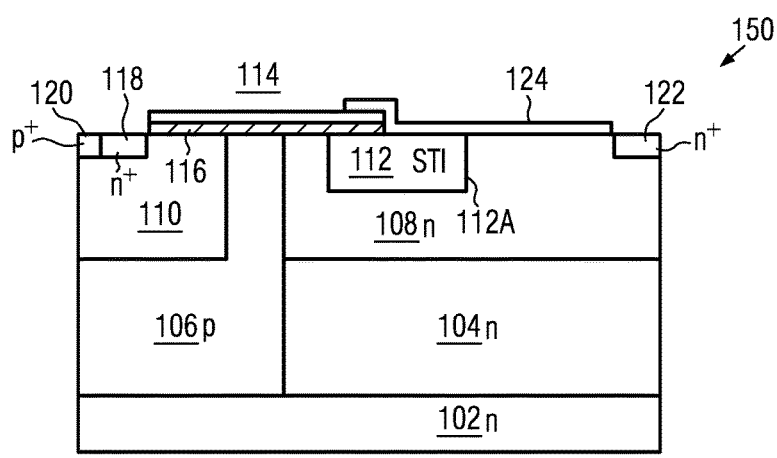
FIG. 1 is a sectional illustration of a conventional LDMOS-transistor, as described in WO 2007/103610.

FIG. 2 illustrates a schematic cross-sectional view of a semiconductor device 90 comprising a small signal transistor 50K and a lateral power field effect transistor or DMOS transistor 50P. The device 90 comprises a substrate, on which are applied appropriate semiconductor layers, for example epitaxially grown silicon layers. In the embodiment shown there is provided a lightly n-doped layer 4 that serves as a body region of the transistor 50P, thus representing a p-channel transistor. On the other hand there is formed in the layer 4 a p-doped body region or bulk region 10 of the transistor 50K that is therefore an n-channel transistor. The lateral size of the small signal transistor 50K is determined by respective trench isolation regions 12. A corresponding trench isolation region 12 is also provided in a drain drift region 8 in order to obtain a superior potential profile, as is already explained in the context of the transistor 150 of FIG. 1. The drain drift region 8 is therefore a corresponding p-doped region in which a heavily doped drain region is to be formed in further manufacturing processes.

In the manufacturing stage shown the transistors 50K and 50P comprise gate electrode structures 14K and 14, respectively, which comprise isolation layers 16K and 16, respectively. Furthermore, an implantation mask 26 is provided that exposes the transistor 50K in order to form shallow n-doped drain and source extension regions 23 in the body region 10. In the embodiment shown the implantation mask 26, which may be provided in the form of a resist mask, for instance, includes an appropriate opening 27 such that a field guiding region 28E is produced in the drain drift region 8, wherein the lateral size and position of the region 28E in the drain drift region 8 are determined by the mask opening 27. For example, the lateral dimension 27L of the opening 27 may be adjusted as is demonstrated by the dashed line in order to generate an appropriate field guiding or bending, respectively, of potential lines depending on the dopant profile that is obtained by an implantation process 25. The implantation process 25 is thus performed as a standard implantation process as required for forming the region 23 in the transistor 50K. The appropriate adaptation of the field guiding behaviour of the region 28E is thus accomplished by constructive measures, i.e. the formation of the implantation mask 26 including the opening 27.

The semiconductor device 90, as shown in FIG. 2, may thus be formed on the basis of standard CMOS processes. That is, prior to or after the formation of the trench isolation regions 12 based on well known techniques, if required, the implantation processes for deeper lying areas of the device 90 are performed, for example for the drain drift region 8 and the body region 10, by applying appropriate masking strategies, followed by processes for forming the gate electrode structures 14K and 14, respectively. To this end, process technologies may be used with which the gate electrode structure 14K having a gate length of 200 nm or less is patterned. Thereafter the mask 26 is formed by appropriate lithography processes.

FIG. 3 illustrates the semiconductor device 90 in a further advanced manufacturing phase, in which a further implantation process 29 is performed on the basis of a mask 30. During the implantation process 29 there are formed in the transistor 50K deep drain and source regions 32 that, in combination with the region 23, result in the desired dopant profile for the transistor 50K after performing corresponding anneal processes.

In the embodiment illustrated the mask 30 includes an opening 31 that defines the lateral position and size and hence the shape of a field guiding region 28 that is produced by the implantation process 29 in the drain drift region 8. The regions 32 and 28 thus have a substantially identical dopant profile in a depth direction T that is to be understood as the vertical direction in FIG. 3. In the embodiment illustrated the entire vertical dopant profile is also determined by the region 28E due to the already previously introduced dopants for forming the region 28E, while in other embodiments (not shown) the dopant profile of the region 28 is exclusively formed by the implantation 29 or exclusively by the implantation 25 of FIG. 2, that is, in the form of the region 28E. Moreover, the implantation 29 and the formation of the mask 30 are performed on the basis of standard process technologies. As shown in illustrative embodiments also a mask opening 33 may be provided, when a heavily n-doped body or bulk connection region 20 is additionally to be formed during the standard implantation process 29. If required a corresponding opening may also be provided during the implantation process 25 of FIG. 2, if an increased dopant concentration at least at the surface is desired, as is the case for the combination of the regions 23 and 32. Thus, when identical implantation conditions are applied for the regions 20 and 28, these regions have substantially identical dopant profiles along the depth direction T.

FIG. 4 illustrates the semiconductor device 90 in a further advanced manufacturing phase, in which, for simplicity, only the transistor 50P is shown. In the manufacturing phase shown a heavily doped source region 18 and the corresponding inversely and heavily doped body connection region 20 are provided, while a heavily doped drain region 22 is formed in the p-doped drain drift region 8. Moreover, one or more field guiding regions 28 and 28A, respectively, are provided in an area of the drift region 8 with appropriate lateral position, size and shape in order to achieve the desired potential line profile in the drift region 8, as is also explained above. Corresponding metal silicide materials 18S, 20S, 22S, 28S are formed on the surface of the heavily doped drain region 18, the heavily doped body connection region 20, the heavily doped source region 22 and, in the embodiment shown, the heavily doped field guiding region 28. Moreover, a metal silicide 14S is also present in the gate electrode structure 14. Furthermore, surface areas of the drift region 8, on which no metal silicide is to be formed, are covered by a silicide blocking mask 24.

The semiconductor device 90 shown in FIG. 4 may be formed on the basis of standard CMOS processes, wherein in particular the heavily doped drain and source regions 18, 22 may be formed in the context of implantation processes for p-type small signal transistors, as is representatively shown for the n-channel transistor 50K in, for example, FIGS. 2, 3 with respect to the formation of the regions 28, 28A and 20 that are inversely doped with respect to the drain and source regions 22, 18. That is, the regions 18 and 22 are formed by standard implantation processes for p-channel transistors while covering the remaining surface of the region 8, whereas the heavily doped field guiding region or regions 28 and 28A, respectively, as well as the heavily doped body connection region 20 are produced during one or more corresponding implantation processes, in which the heavily doped drain and source regions of n-channel transistors are formed. In embodiments, in which the regions 20 and 28 or 28A have been formed under identical process conditions, these regions have substantially identical dopant profiles in the depth direction, that is, in FIG. 4 the vertical direction. After the generation of the corresponding dopant profiles appropriate anneal techniques are performed in order to adjust the final lateral and vertical profile of these doped regions. Thereafter, the silicide blocking mask 24 may be formed by standard deposition techniques, lithography processes and patterning techniques. To this end, materials such as silicon dioxide, silicon nitride and the like are appropriate. Thereafter, metal silicide is formed, for instance by applying an appropriate refractory metal and causing reaction thereof with the silicon on in the exposed semiconductor surfaces. After the removal of excess metal the structure shown in FIG. 4 is obtained.

FIG. 5 schematically illustrates the semiconductor device 90, wherein a transistor 50N is provided, which is produced additionally or alternatively with respect to the transistor 50P (cf. FIGS. 2 to 4). The transistor 50N is an n-channel transistor and is thus a transistor complementary to the transistor 50P. In this case the drift region 8 is an n-doped region, while the body region 4 is a p-doped region. Analogously, the heavily doped drain and source regions 18, 22 are heavily n-doped regions, while the body connection region 20 is a heavily p-doped region. Accordingly, the heavily doped field guiding region 28 is a p-doped region.

The transistor 50N may also be formed on the basis of standard CMOS processes, wherein during the implantation of drain and source regions and/or extension regions of small signal transistors of p-conductivity the one or more regions 28 may be formed partly or completely together with the region 20. Similar processes may be applied, as are previously explained for the transistor 50P, wherein, however, the dopant types to be introduced during the corresponding implantation processes are to be reversed.

The LDMOS transistors 50P, 50N shown in FIGS. 2 to 4 on the one hand and in FIG. 5 on the other hand are different from each other with respect to the type of conductivity and with respect to the fact that in the pLDMOS 50P the implantation region 8 forming the drift area or path terminates below the gate 14. In the nLDMOS 50N the drift path consists of the corresponding part of the n-well 8 and the body region 4 is formed in the drift region 8 as a well. Both LDMOS transistors have drift paths extending partially below the STI region 12, wherein in one preferred embodiment a field guiding region 28 is disposed on the STI edge 12A facing the drain region 22 such that an appropriate field profile is obtained towards the surface and towards the drain region 22.

By using the same methods, i.e. also identical mask levels for the transistors 50K, 50P, 50N a cost efficient and reliable production is achieved. In one embodiment only implantation steps present in the standard CMOS processes for source and drain regions are used for the highly doped regions 28, 28A such that no additional masking steps are required. In this case, the inventive floating regions 28, 28A guarantee an appropriate field guiding, that is, a forced guiding of the potential lines (bending) in the vicinity of the drain region 22 without disturbing the RESURF balance in the depth or creating electrically chargeable zones. Of particular advantage is the adjustability of the target geometry and/or target concentration of the inventive floating regions 28, 28A by co-operation of STI edge 12A and implantation masks, for example the masks 26 and 30.

LIST OF REFERENCE SIGNS (EXCERPT)

102 n-layer
104, 106 p-layer
108 n-doped drift area (extended drain)
110 p-doped region (bulk or body)
112 trench isolation region (STI)
114 gate electrode
116 gate insulator
118 n+ source
120 p+-bulk connection or body region connection
122 n+-drain
124 dielectric insulation layer (silicide blocker)
150 n-LDMOS transistor
4 body region or bulk region 8 p or n-drift region
12 STI
14, 14K gate
16, 16K gate insulation layer
18 source
20 bulk or body connection
22 drain
23 drain and source extension region
24 silicide blocker
25 extension implantation for shallow drain and source extension regions (LDD implantation)
26 resist mask
27 mask opening
27L lateral dimension of the mask opening
28, 28A highly doped region of opposite conductivity type with respect to source and drain
28E field guiding region
29 deep drain and source implantation
30 resist mask
31 mask opening
32 deep drain and source regions
33 mask opening
50K small signal transistor (voltage range <=15V)
50P p-channel power transistor (voltage range above 15V)
50N n-channel power transistor (voltage range above 15V)
90 semiconductor device

We claim:

1. A semiconductor device comprising:
a small signal transistor and a lateral power field effect transistor adjacent to each other and separated by a first trench isolation region, the lateral power field effect transistor comprising:
a source region of a first conductivity type;
a drain region of the first conductivity type;
a drain drift region of the first conductivity type and having a surface;
a second trench isolation region that is at least partially embedded in the drain drift region;
a field guiding region doped with a second conductivity type, wherein the second conductivity type is an inverse of the first conductivity type of the source and drain regions; and
a body connection region of the second conductivity type directly adjacent to the source region;
wherein a maximum dopant concentration of the field guiding region is greater than a maximum dopant concentration of the body connection region;
the small signal transistor comprising:
a gate structure;
a deep drain region and a deep source region of the second conductivity type; and
a shallow drain extension region and a shallow source extension region of the second conductivity type.

2. The semiconductor device of claim 1, wherein the field guiding region is provided as a region having a freely adjustable potential without an electrical connection.

3. The semiconductor device of claim 1, wherein at least one further field guiding region of the second conductivity type is provided in the drain drift region of the lateral power field effect transistor.

4. The semiconductor device of claim 1, wherein the field guiding region is directly adjacent to the second trench isolation region facing the drain region.

5. The semiconductor device of claim 1, wherein the surface of the drain drift region is provided with a layer for preventing formation of silicide.

6. A semiconductor device comprising:
a small signal transistor and a lateral power field effect transistor adjacent to each other and separated by a first trench isolation region, the lateral power field effect transistor comprising:
a source region of a first conductivity type;
a drain region of the first conductivity type;
a drain drift region of the first conductivity type and having a surface;
a second trench isolation region that is at least partially embedded in the drain drift region; and
a field guiding region doped with a second conductivity type, wherein the second conductivity type is an inverse of the first conductivity type of the source and drain regions;
the small signal transistor comprising:
a gate structure;
a deep drain region and a deep source region of the second conductivity type; and
a shallow drain extension region and a shallow source extension region of the second conductivity type;
wherein the shallow drain extension region and the shallow source extension region of the small signal transistor and the field guiding region of the power field effect transistor have a same dopant profile in a depth direction thereof.

7. A semiconductor device comprising:
a small signal transistor and a lateral power field effect transistor adjacent to each other and separated by a first trench isolation region, the lateral power field effect transistor comprising:
a source region of a first conductivity type;
a drain region of the first conductivity type;
a drain drift region of the first conductivity type and having a surface;
a second trench isolation region that is at least partially embedded in the drain drift region; and
a field guiding region doped with a second conductivity type, wherein the second conductivity type is an inverse of the first conductivity type of the source and drain regions;
the small signal transistor comprising:
a gate structure;
a deep drain region and a deep source region of the second conductivity type; and
a shallow drain extension region and a shallow source extension region of the second conductivity type;
wherein the deep drain region and the deep source region of the small signal transistor and the field guiding region of the power field effect transistor have a same dopant profile in a depth direction thereof.

8. A semiconductor device comprising:
a small signal transistor and a lateral power field effect transistor adjacent to each other and separated by a first trench isolation region, the lateral power field effect transistor comprising:
a source region of a first conductivity type;
a drain region of the first conductivity type;
a drain drift region of the first conductivity type and having a surface;
a second trench isolation region that is at least partially embedded in the drain drift region; and a field guiding region doped with a second conductivity type, wherein the second conductivity type is an inverse of the first conductivity type of the source and drain regions;
the small signal transistor comprising:
a gate structure;
a deep drain region and a deep source region of the second conductivity type; and
a shallow drain extension region and a shallow source extension region of the second conductivity type;
wherein the small signal transistor comprises a gate electrode as the gate structure having a gate length of at most 200 nm.

9. A semiconductor device comprising:
a small signal transistor and a lateral power field effect transistor adjacent to each other and separated by a first trench isolation region, the lateral power field effect transistor comprising:
a source region of a first conductivity type;
a drain region of the first conductivity type;
a drain drift region of the first conductivity type and having a surface;
a second trench isolation region that is at least partially embedded in the drain drift region; and
a field guiding region doped with a second conductivity type, wherein the second conductivity type is an inverse of the first conductivity type of the source and drain regions;
the small signal transistor comprising:
a gate structure;
a deep drain region and a deep source region of the second conductivity type; and
a shallow drain extension region and a shallow source extension region of the second conductivity type; and
a second lateral power field effect transistor having a second source region of the second conductivity type, a second drain region of the second conductivity type, a second drain drift region of the second conductivity type, a third trench isolation region at least partially embedded in the second drain drift region, and at least one second doped field guiding region of the first conductivity type.

10. A semiconductor device comprising:
a lateral power field effect transistor comprising:
a source region of a first conductivity type;
a drain region of the first conductivity type;
a drain drift region of the first conductivity type and having a surface;
a trench isolation region at least partially embedded in the drain drift region;
a field guiding region of a second conductivity type, wherein the second conductivity type is an inverse of the first conductivity type; and
a body connection region of the second conductivity type directly adjacent to the source region;
wherein a maximum dopant concentration of the field guiding region is greater than a maximum dopant concentration of the body connection region.

11. The semiconductor device of claim 10, further comprising a small signal transistor comprising:
a gate structure;
a deep drain region and a deep source region of the second conductivity type; and
a shallow drain extension region and a shallow source extension region of the second conductivity type.

12. The semiconductor device of claim 11, wherein the shallow drain extension region and the source extension region of the small signal transistor and the field guiding region of the lateral power field effect transistor have a same dopant profile in a depth direction thereof.

13. The semiconductor device of claim 11, wherein the deep drain region and the deep source region of the small signal transistor and the field guiding region of the lateral power field effect transistor have a same dopant profile in a depth direction thereof.

* * * * *